United States Patent
Bajuri et al.

(10) Patent No.: US 10,083,899 B2
(45) Date of Patent: Sep. 25, 2018

(54) SEMICONDUCTOR PACKAGE WITH HEAT SLUG AND RIVET FREE DIE ATTACH AREA

(71) Applicant: Infineon Technologies AG, Neubiberg (DE)

(72) Inventors: Mohd Kahar Bajuri, Melaka (MY); Edmund Sales Cabatbat, Roxas (PH); Gaylord Evangelista Cruz, Muntinlupa (PH); Amirul Afiq Hud, Melaka (MY); Teck Sim Lee, Melaka (MY); Norbert Joson Santos, Baguio (PH); Chiew Li Tai, Melaka (MY); Chin Wei Yang, Seremban (MY)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/412,108

(22) Filed: Jan. 23, 2017

(65) Prior Publication Data

US 2018/0211907 A1   Jul. 26, 2018

(51) Int. Cl.
*H01L 23/40* (2006.01)
*H01L 23/495* (2006.01)
*H01L 23/31* (2006.01)
*H01L 21/48* (2006.01)
*H01L 21/56* (2006.01)

(52) U.S. Cl.
CPC .... *H01L 23/49568* (2013.01); *H01L 21/4853* (2013.01); *H01L 21/4882* (2013.01); *H01L 21/565* (2013.01); *H01L 23/3121* (2013.01); *H01L 23/49555* (2013.01); *H01L 23/49575* (2013.01)

(58) Field of Classification Search
CPC ......... H01L 23/49575; H01L 23/49579; H01L 23/49568; H01L 21/4882; H01L 21/4853; H01L 21/4871; H01L 21/4875; H01L 23/49503; H01L 23/49506; H01L 23/4951; H01L 23/49513; H01L 33/62; H01L 23/40; H01L 23/4093; H01L 2023/4068; H01L 2023/4037; H01L 23/36
See application file for complete search history.

(56) References Cited

U.S. PATENT DOCUMENTS

| | | | |
|---|---|---|---|
| 5,482,898 A * | 1/1996 | Marrs | H01L 21/565 257/E21.504 |
| 6,239,487 B1 * | 5/2001 | Park | H01L 23/4334 257/666 |
| 6,329,706 B1 | 12/2001 | Nam | |

(Continued)

FOREIGN PATENT DOCUMENTS

| | | |
|---|---|---|
| EP | 0782184 A1 | 7/1997 |
| TW | 200924125 A | 6/2009 |

*Primary Examiner* — Sonya D McCall Shepard
(74) *Attorney, Agent, or Firm* — Murphy, Bilak & Homiller, PLLC

(57) ABSTRACT

A method of forming a semiconductor device package includes providing a lead frame having a peripheral structure and a heat slug having an upper and lower surface, the heat slug being attached to the peripheral structure. A semiconductor die is attached to the heat slug. The semiconductor die is encapsulated with a molding compound while the heat slug is attached to the peripheral structure. The heat slug is completely devoid of fasteners before the encapsulating.

14 Claims, 11 Drawing Sheets

4B

(56) References Cited

U.S. PATENT DOCUMENTS

| | | | | |
|---|---|---|---|---|
| 6,831,352 B1 * | 12/2004 | Tsai | ................. | H01L 23/49503 |
| | | | | 257/666 |
| 7,482,679 B2 * | 1/2009 | Aripin | ................. | H01L 23/4334 |
| | | | | 257/666 |
| 8,686,545 B2 * | 4/2014 | Minamio | ............ | H01L 21/4878 |
| | | | | 257/666 |
| 2003/0020148 A1 | 1/2003 | Kiyohara | | |
| 2007/0057361 A1 | 3/2007 | Lange et al. | | |
| 2008/0048304 A1 | 2/2008 | Liu et al. | | |
| 2015/0170986 A1 | 6/2015 | Szymanowski et al. | | |
| 2015/0270204 A1 | 9/2015 | Kuroda | | |
| 2017/0338194 A1 * | 11/2017 | Gittemeier | .............. | H01L 23/66 |

* cited by examiner

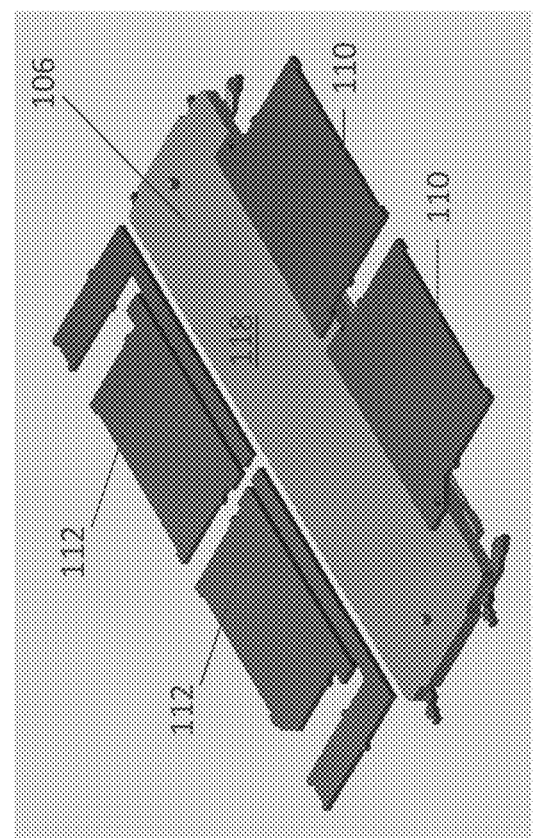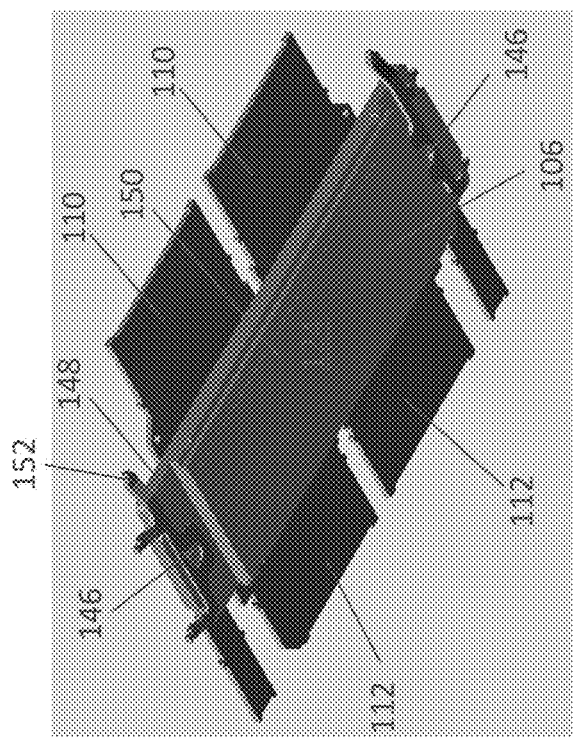
FIGURE 8

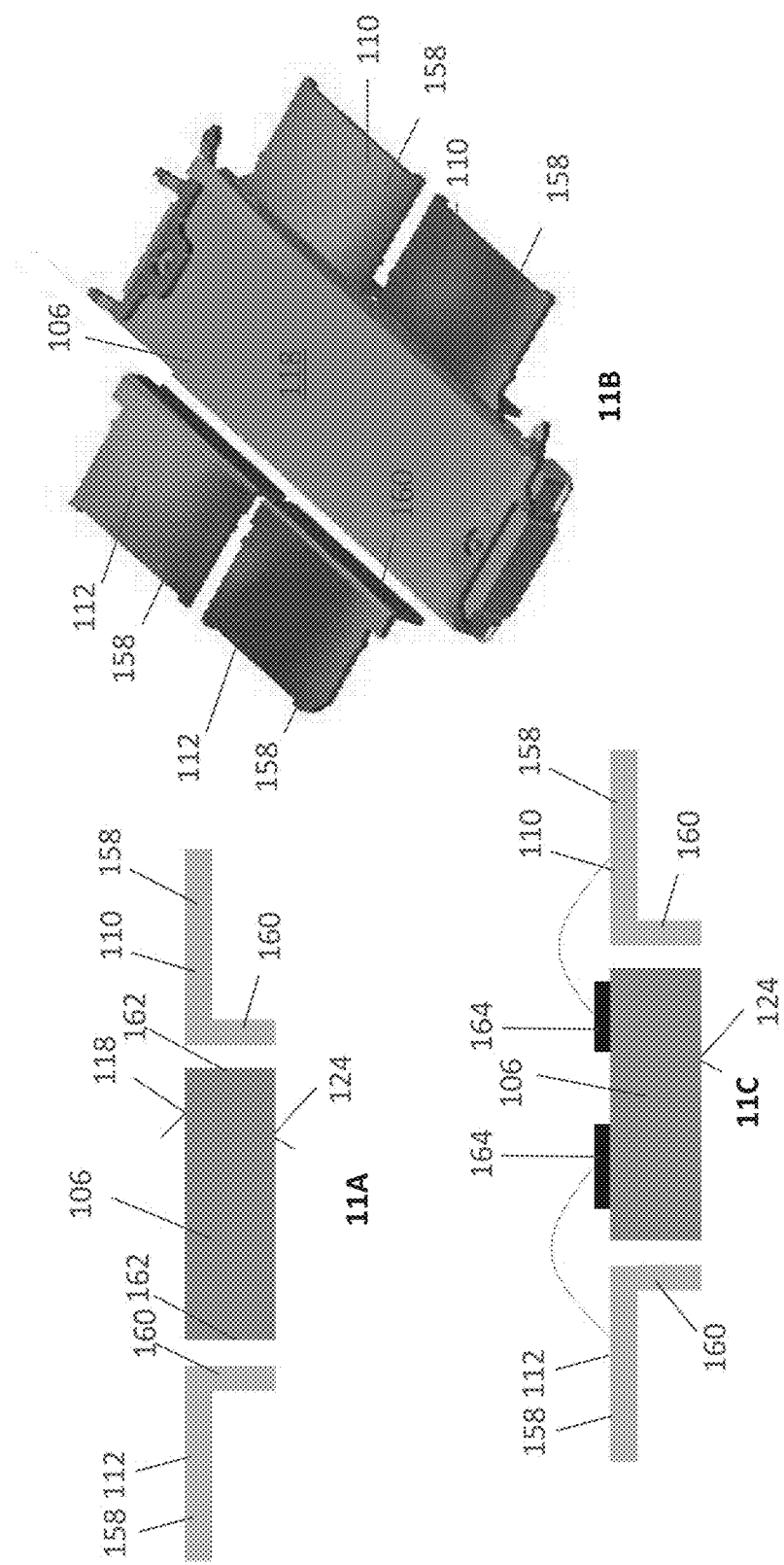

US 10,083,899 B2

SEMICONDUCTOR PACKAGE WITH HEAT SLUG AND RIVET FREE DIE ATTACH AREA

TECHNICAL FIELD

The present invention generally relates to semiconductor device packaging and more particularly relates to methods of forming a semiconductor package with a thermally conductive heat slug and a corresponding package structure.

BACKGROUND

Semiconductor packages are commonly used to house and protect integrated circuits, such as amplifiers, controllers, ASIC devices, sensors, etc. In a semiconductor package, an integrated circuit (or circuits) is mounted to a substrate. The semiconductor package typically includes an electrically insulating encapsulant material, such as plastic or ceramic, that seals and protects the integrated circuits from moisture and dust particles. Electrically conductive leads that are connected to the various terminals of integrated circuits are accessible outside the semiconductor package.

In some package designs, the package substrate is configured as a so-called "heat slug" or "heat sink." A package level heat slug is designed to pull heat away from the integrated circuit. Typically, the heat slug is formed from a thermally conductive material (e.g., metal). In some package configurations, the heat slug also serves as an electrical terminal that provides a reference potential (e.g., ground) to the dies that are mounted thereon.

Designers are continuously seeking to improve packaging designs. One notable design consideration that is gaining considerable attention is the total footprint of the package. As technology progresses, there is a strong demand to reduce the size and/or cost of most electronic components. Another notable design consideration is heat dissipation. Heat consumption per area of modern integrated circuit devices continues to increase as devices become faster and more powerful while simultaneously becoming smaller. As a result, there is much greater emphasis on cooling solutions to prevent modern integrated circuits from failure or decreased performance due to overheating. The desire to reduce the total footprint of the package often conflicts with the desire to optimize the heat dissipation of semiconductor packages, as larger heat sinks are typically used to provide more cooling.

RF Applications present unique challenges with respect to package design. Many packaged RF devices include two or more integrated circuits and corresponding bond wires that connect the integrated circuits to the package leads. As these integrated circuits typically operate at high frequency, there is a substantial likelihood of inductive coupling between the bond wires. This inductive coupling can cause interference that can degrades signal integrity, and can even cause complete failure. As package sizes continue to decrease, this issue presents a greater challenge as electrical isolation between the different integrated circuits becomes harder to achieve. Current isolation techniques include providing shield structures between the various integrated circuits of the package. However, these shield structures utilize value package space.

SUMMARY

A method of forming a semiconductor device package is disclosed. According to an embodiment, the method includes providing a lead frame having a peripheral structure and a heat slug having an upper and lower surface, the heat slug being attached to the peripheral structure. A semiconductor die is attached to the heat slug. The semiconductor die is encapsulated with a molding compound while the heat slug is attached to the peripheral structure. The heat slug is completely devoid of fasteners before the encapsulating.

According to another embodiment, the method includes providing a lead frame having a peripheral structure and a heat slug having an upper and lower surface, the heat slug being attached to the peripheral structure. A semiconductor die is attached to the heat slug. The semiconductor die is encapsulated with a molding compound while the heat slug is attached to the peripheral structure. Either: (1) encapsulating the semiconductor die includes covering the entire die attach area with the molding compound while the entire rear surface of the heat slug is exposed from the molding compound, or (2) the heat slug is attached to the peripheral structure at a first location that is outside of the upper surface of the heat slug, or (3) the lead frame includes a first lead that is bent with a first section that is substantially perpendicular to a second section, and the first lead is aligned with the heat slug such that, after encapsulation, the first section extends away from the heat slug and in a direction that is substantially parallel to the upper surface of the heat slug, and the second section extends in a direction that is substantially parallel to sidewalls of the heat slug, the sidewalls extending between the upper and rear surfaces of the heat slug.

A packaged semiconductor device is disclosed, according to an embodiment, the packaged semiconductor device includes a heat slug including an upper surface, and a rear surface opposite the upper surface. A semiconductor die is attached to the heat slug. A first lead is electrically connected to the semiconductor die. A mold body encapsulates the semiconductor die. The first lead protrudes out of the mold body. The upper surface of the heat slug is devoid of fasteners.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 4A and 4B depicts a packaged Doherty amplifier in which the lower side of the package is completely coextensive with the rear surface of the heat slug, according to an embodiment. FIG. 4A depicts a lower side of the package and FIG. 4B depicts a cross-sectional view of the package.

FIGS. 5A, 5B, 5C and 5D, depicts a rivetless technique for forming a packaged Doherty amplifier, according to an embodiment. FIG. 5A depicts a plan view perspective of the lead frame and heat slug before die attach and encapsulation. FIG. 5B depicts a side view perspective of the lead frame and heat slug before die attach and encapsulation. FIG. 5C depicts a plan view perspective of the device after encapsulation and before lead trim. FIG.

5D depicts a plan view perspective of the device after encapsulation and after lead trim.

Figure 6:
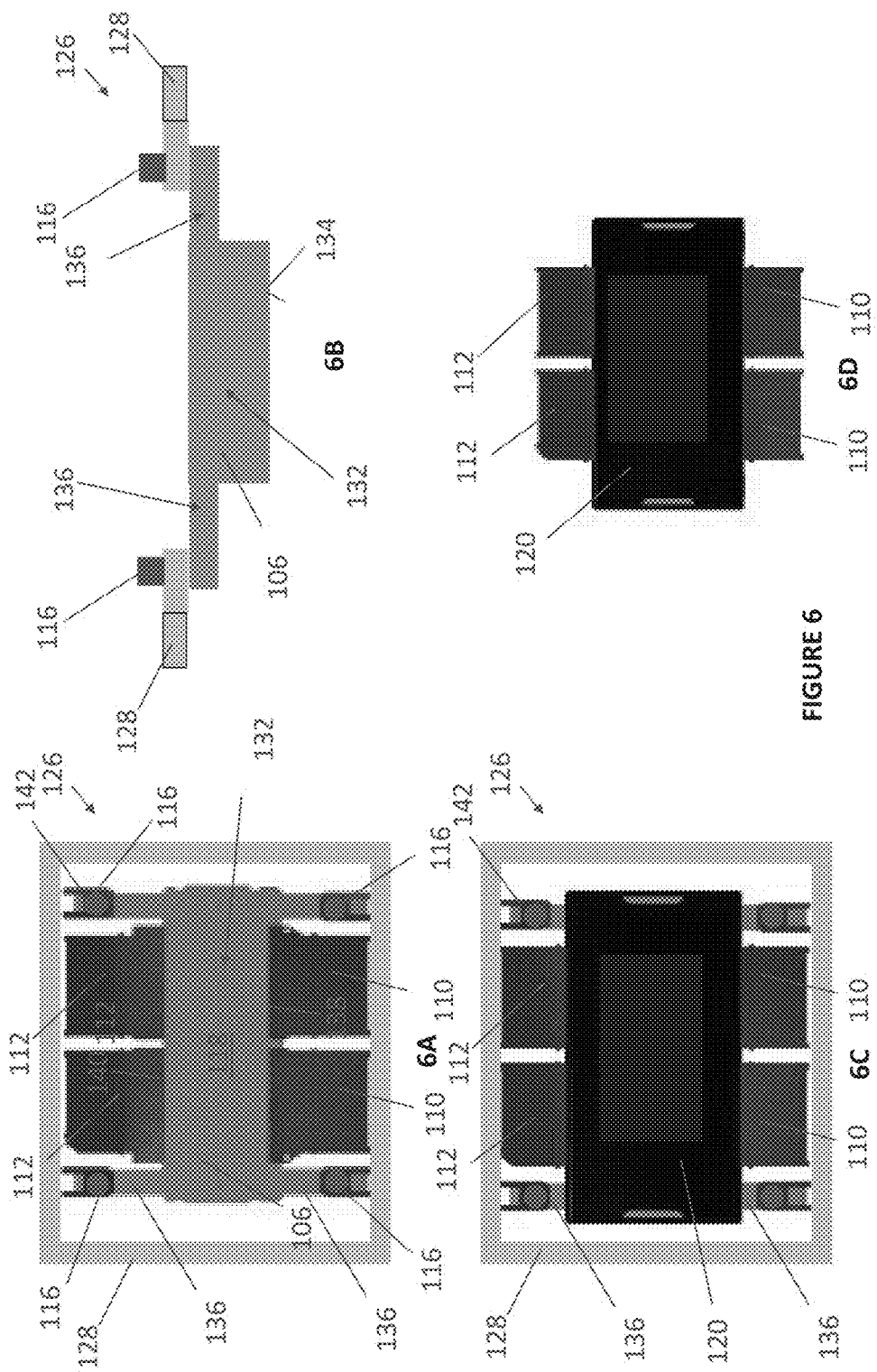

FIG. 6, which includes FIGS. 6A, 6B, 6C and 6D, depicts a technique for forming a packaged Doherty amplifier in which the rivets are provided on a protrusion of the heat slug that is outside of the die attach area, according to an embodiment. FIG. 6A depicts a plan view perspective of the lead frame and heat slug before die attach and encapsulation. FIG. 6B depicts a side view perspective of the lead frame and heat slug before die attach and encapsulation. FIG. 6C depicts a plan view perspective of the device after encapsulation and before lead trim. FIG. 6D depicts a plan view perspective of the device after encapsulation and after lead trim.

Figure 7:
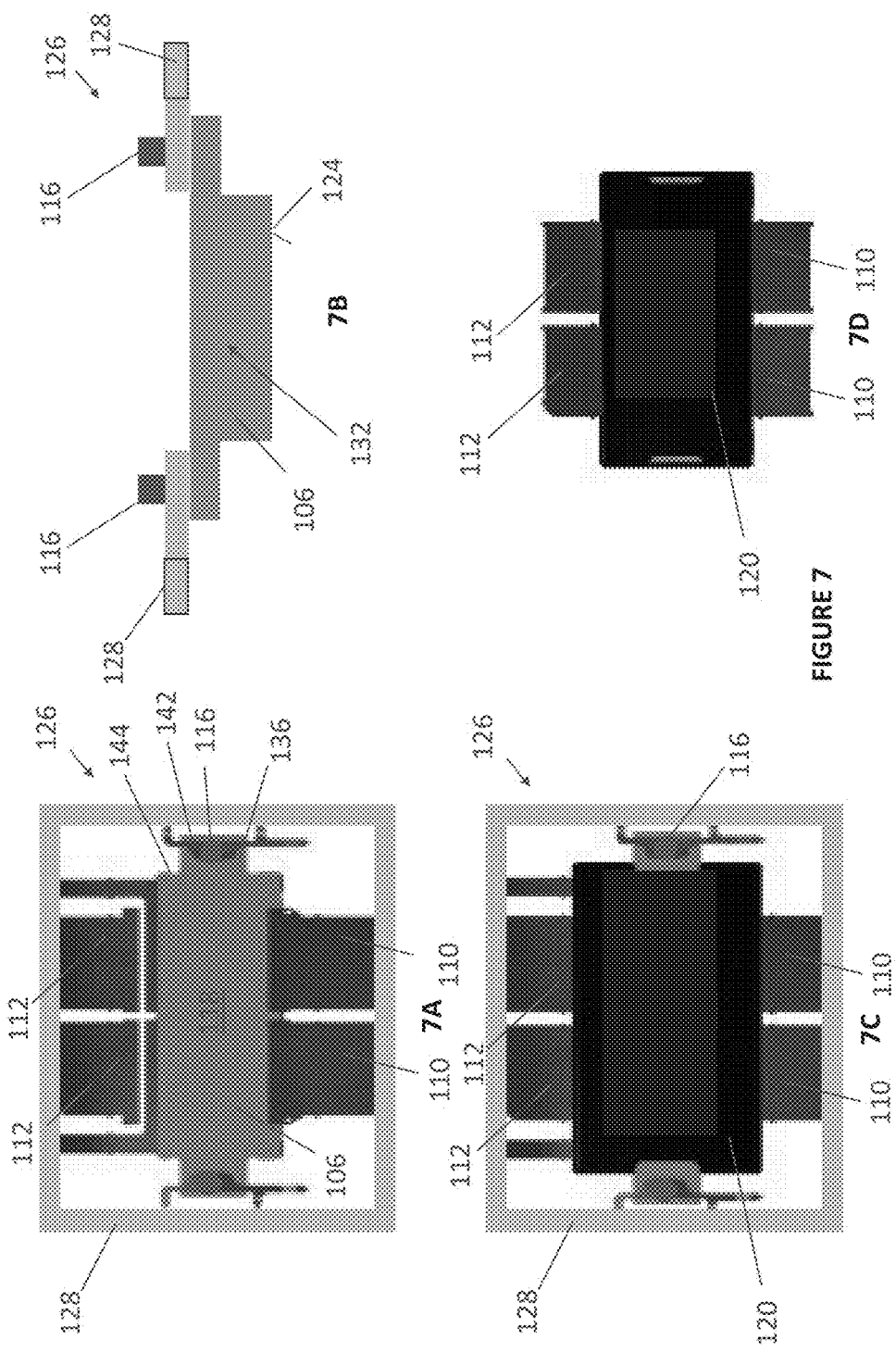

FIG. 7, which includes FIGS. 7A, 7B, 7C and 7D depicts a technique for forming a packaged Doherty amplifier in which the rivets are provided on a protrusion of the heat slug that is outside of the die attach area, according to another embodiment. FIG. 7A depicts a plan view perspective of the lead frame and heat slug before die attach and encapsulation. FIG. 7B depicts a side view perspective of the lead frame and heat slug before die attach and encapsulation. FIG. 7C depicts a plan view perspective of the device after encapsulation and before lead trim. FIG. 7D depicts a plan view perspective of the device after encapsulation and after lead trim.

FIG. 8, which includes FIGS. 8A and 8B, depicts a heat slug with a dual thickness rectangular body section in which a rivet location is disposed on the bottom side of the rectangular body section, according to another embodiment. FIG. 8A depicts a rear surface of the heat slug. FIG. 8B depicts an upper surface 118 of the heat slug.

Figure 9:
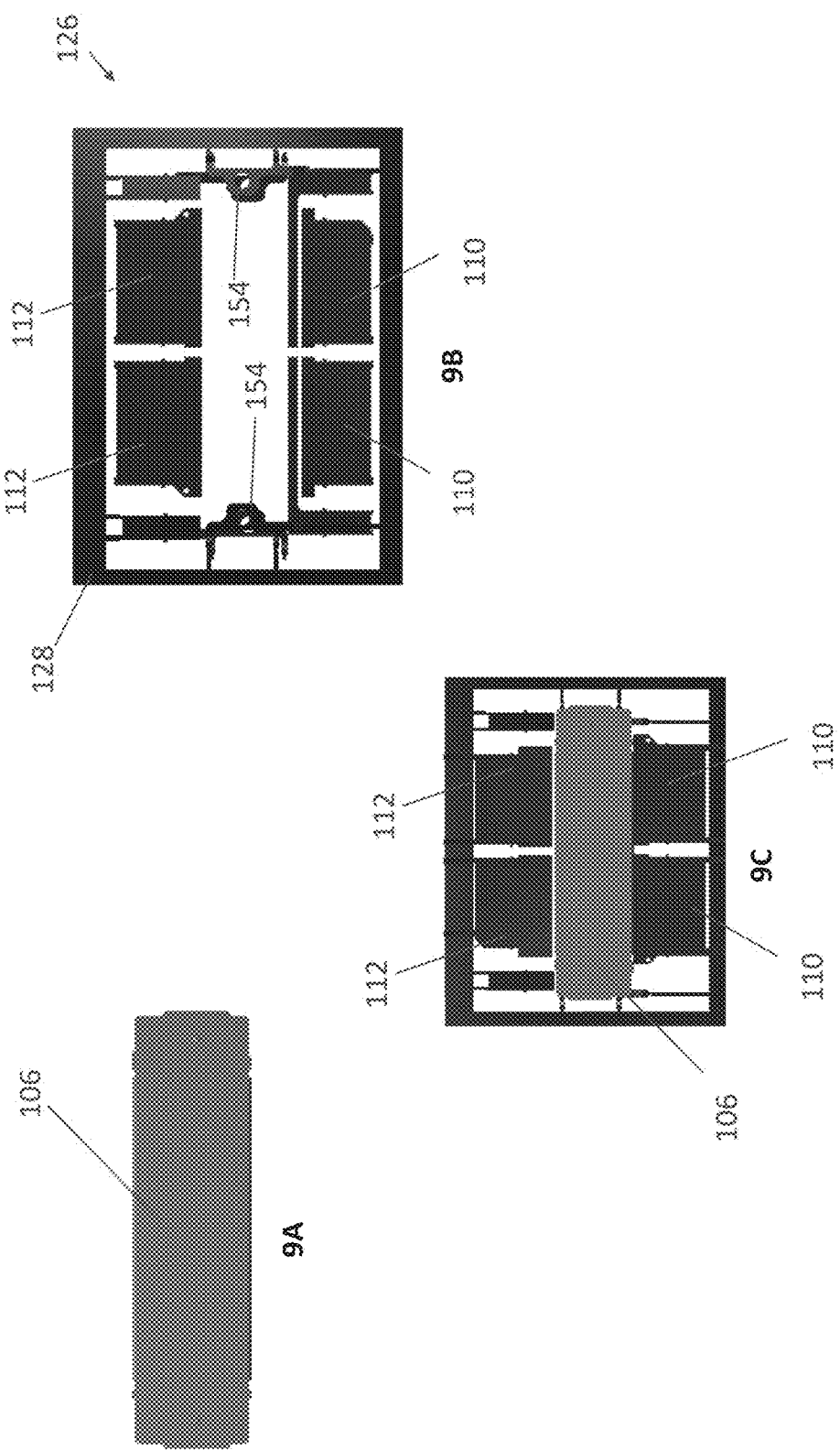

FIG. 9, which includes FIGS. 9A, 9B and 9C, depicts a technique for forming a packaged semiconductor device using the heat slug of FIG. 8, according to an embodiment. FIG. 9A depicts a plan view of the heat slug, FIG. 9B depicts a plan view of the lead frame. FIG. 9C depicts the heat slug affixed to the lead frame.

Figure 10:
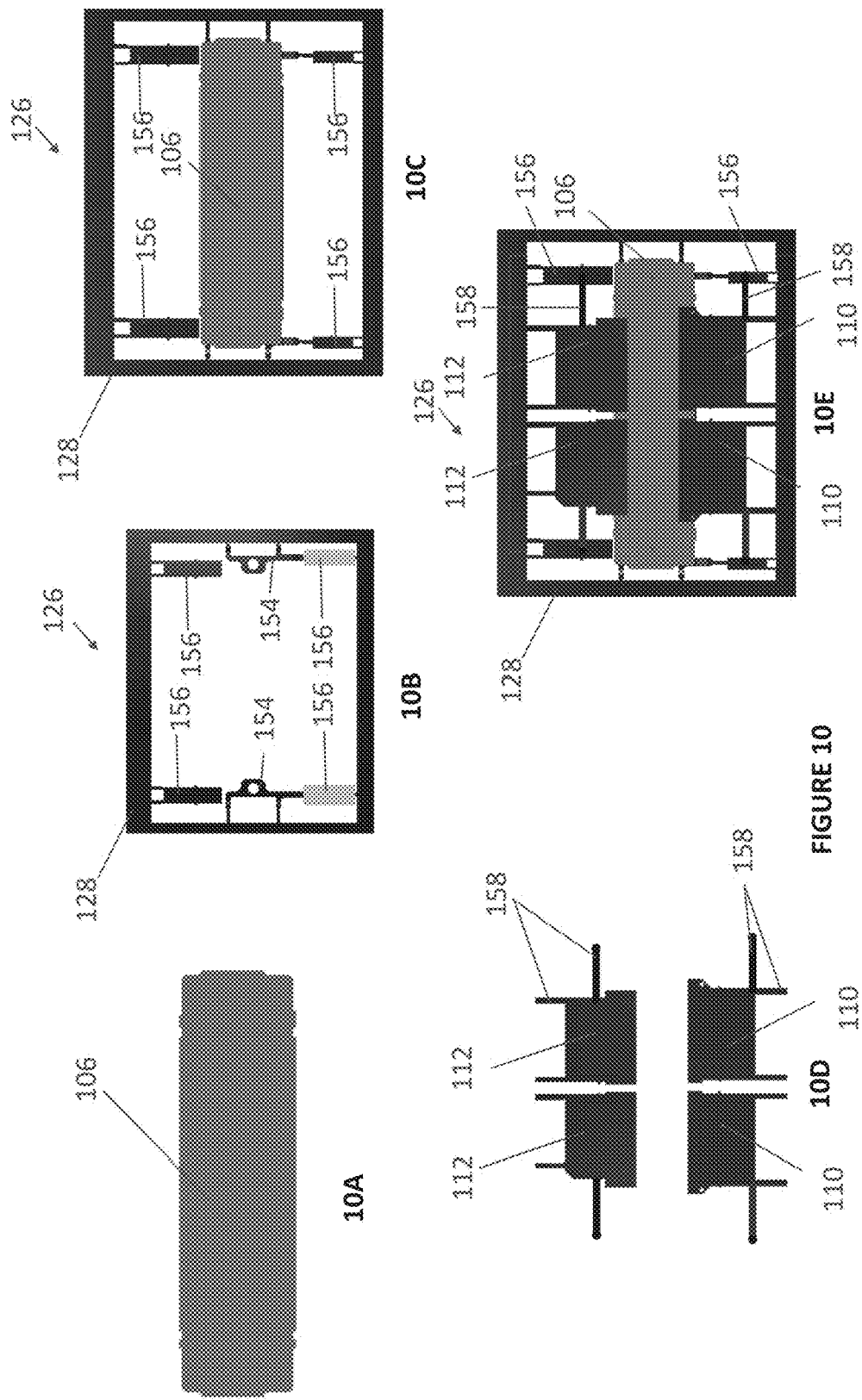

FIG. 10, which includes FIGS. 10A, 10B, 10C, 10D and 10E depicts a technique for forming a packaged semiconductor device using the heat slug of FIG. 8, according to another embodiment. FIG. 10A depicts a plan view of the heat slug. FIG. 10B depicts a plan view of the lead frame. FIG. 10C depicts the heat slug affixed to the lead frame. FIG. 10D a plan view of the input leads before attachment. FIG. 10E depicts the input leads affixed to the lead frame.

FIG. 11, which includes FIGS. 11A, 11B and 11C, depicts a technique for forming a packaged semiconductor device with input and output leads that bend downward. FIG. 11A depicts a side view of the heat slug and the leads before die attach and wire bonding. FIG. 11B depicts an isometric view of the heat slug and the leads before die attach and wire bonding. FIG. 11C depicts a side view of the heat slug and the leads after die attach and wire bonding.

DETAILED DESCRIPTION

Figure 1:
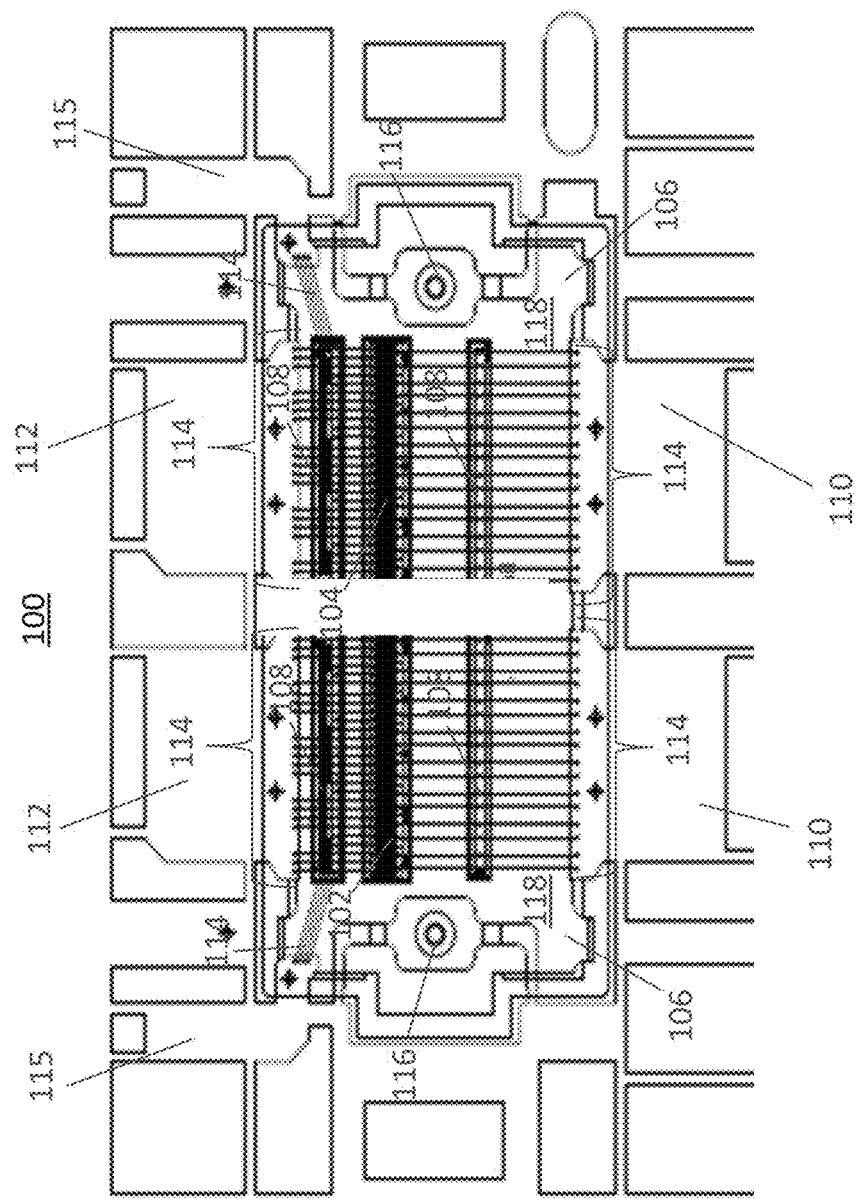
FIG. 1 depicts the internal configuration of a packaged Doherty amplifier from a plan view perspective, according to an embodiment.

Referring to FIG. 1, the interior configuration of a Doherty amplifier 100 semiconductor package is illustrated, according to an embodiment. This figure illustrates an exemplary layout of the integrated circuits, lead frame, and electrical connections for the Doherty amplifier 100. The integrated circuits include a main amplifier 102 and a peaking amplifier 104, which can each implemented as transistor dies, e.g., MOSFETs (metal-oxide semiconductor field-effect transistor), LDMOS (laterally-diffused metal-oxide semiconductor) devices, or HEMT (high electron mobility transistor) devices, etc. These transistor dies are configured as vertical devices, with a reference terminal (e.g., a source terminal) that directly faces the package substrate and makes direct electrical contact with the substrate 106. Input and output terminals (e.g., gate and drain terminals) of the transistor dies are disposed on an upper side of the transistor dies. In addition, the integrated circuits may include chip capacitors 108 mounted on and electrically connected to the substrate 106. These chip capacitors 108 are used to form part of input and output impedance matching networks that are incorporated into the packaged Doherty amplifier 100.

The substrate 106 is formed from an electrically and thermally conductive material, such as copper, aluminum, and alloys thereof. The substrate 106 provides the reference potential terminal for the packaged Doherty amplifier 100. Additionally, the substrate 106 acts as a heat slug that is configured to dissipate heat away from the transistor dies.

The package includes electrically conductive input and output leads 110, 112 that provide the input and output terminals for both the main amplifier 102 and the peaking amplifier 104. Electrical connections between main amplifier 102, the peaking amplifier 104, the chip capacitors 108 and the input and output leads 110, 112 are provided by a number of electrically conductive bond wires 114. Any of a variety of commonly known electrical connection techniques, such as ribbon, may also be used to complete these electrical connections.

The package may also include an additional lead 115 that provides a discrete electrical terminal for the packaged Doherty amplifier 100. In the depicted embodiment, this additional lead 115 is configured as a DC bias lead that is connected to the output matching network by additional bond wires 114.

In the package design depicted in FIG. 1, rivets 116 (i.e., metal fasteners) are disposed on the upper surface 118 of the substrate 106. These rivets 116 are used to physically affix the substrate 106 to the lead frame during the package assembly process. As can be seen, the rivets 116 substantially reduce the available die attach area on the upper surface 118 of the substrate 106. Thus, due to the presence of the rivets 116 the available die attach area on the upper surface 118 of the substrate 106 for a given substrate 106 size decreases.

Figure 2:
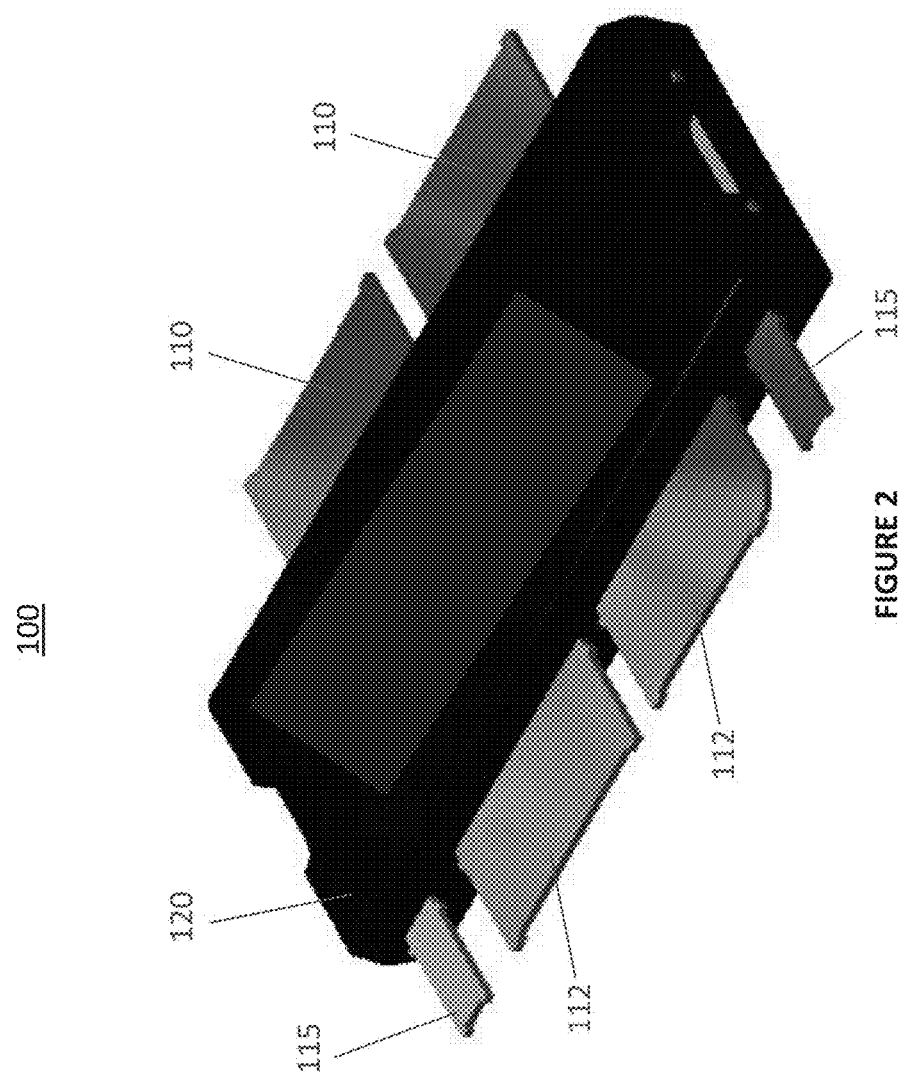
FIG. 2 depicts the exterior of a packaged Doherty amplifier from an isometric view perspective, according to an embodiment.
Figure 3:
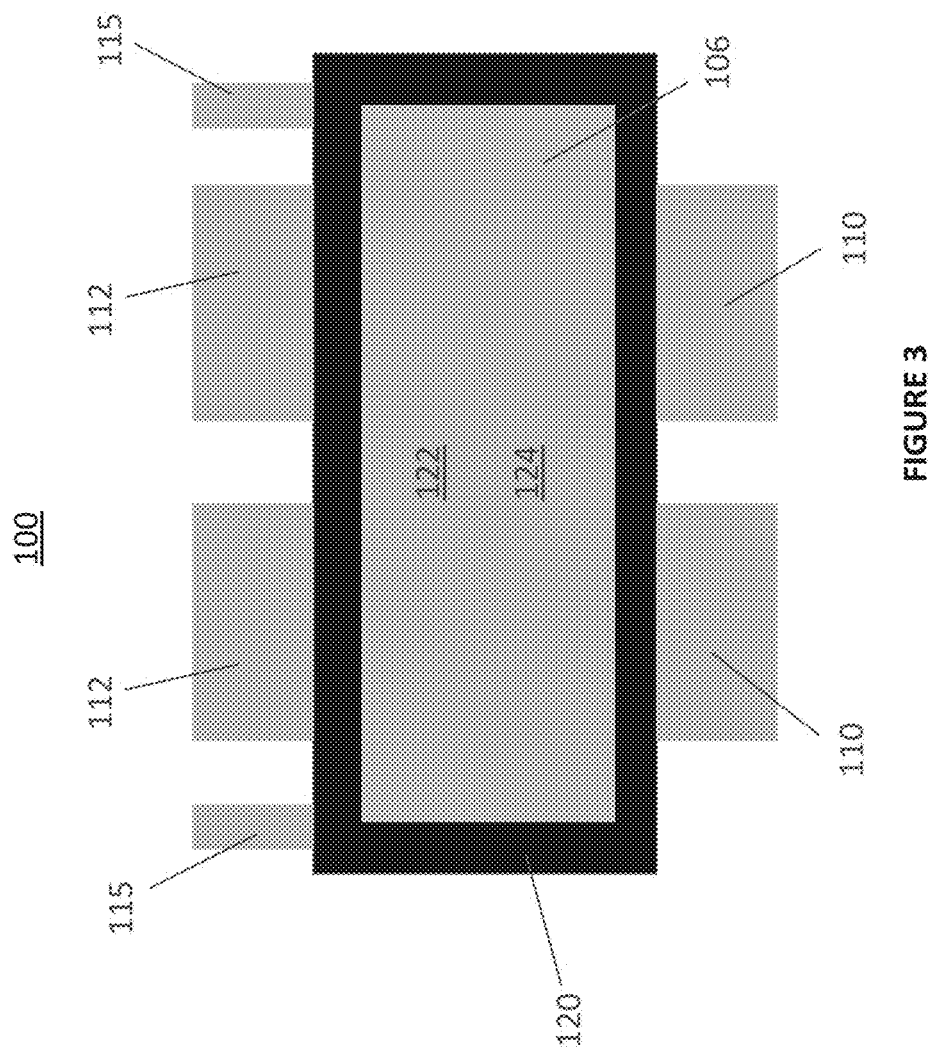
FIG. 3 depicts a lower side of a packaged Doherty amplifier, according to an embodiment.

Referring to FIGS. 2 and 3, an exterior of the packaged Doherty amplifier 100 is depicted, according to an embodiment. The packaged Doherty amplifier 100 includes an electrically insulating molding compound 120, such as a thermosetting plastic, that encloses and protects the integrated circuits and electrical connections depicted in FIG. 1. The molding compound 120 can be formed according to any of a variety of conventionally known molding techniques, such as an oversold technique. The molding compound 120 partially covers the package leads such that the leads protrude out of the molding compound 120 while completely enclosing the integrated circuits and bond wires 114.

The packaged Doherty amplifier 100 is designed to interface with a global circuit, such as a printed circuit board. For example, the packaged Doherty amplifier 100 can be placed in the socket of a printed circuit board such that conductive lines of the circuit board directly contact and electrically connect to the various leads of the package.

As shown in FIG. 3, a lower side 122 of the packaged Doherty amplifier 100 semiconductor is depicted. As can be seen, a portion of the lower side 122 includes an exposed conductor. This exposed conductor corresponds to the rear surface 124 of the substrate 106 upon which the integrated circuits are mounted. This design enables the packaged Doherty amplifier 100 to interface with an external heat sink, which can be provided in the socket of a printed circuit board. The molding compound 120 is overmolded around the substrate 106 such that the molding compound 120 is present around the periphery at the lower side 122 of the packaged Doherty amplifier 100.

According to embodiments described herein, the packaged Doherty amplifier 100 is modified in several aspects to improve performance/cost. A first modification relates to the design of the substrate 106, i.e., the heat slug 106. According to embodiments that will be further described below, the heat slug 106 is enlarged. According to one embodiment, the heat slug 106 occupies the entire lower side 122 of the packaged Doherty amplifier 100. This configuration provides better heat transfer efficiency by enlarging the thermally conductive structure that carries heat away from the integrated circuits. In addition, in the case that the packaged Doherty Amplifier 100 is connected to an external heat sink, the contact surface area between the heat slug 106 and the external heat sink is maximized. Moreover, this configuration enables a greater lateral overlap between the package leads) (i.e., the input and output leads 110, 112) and the heat slug 106. This overlap introduces more capacitance between the input and output leads 110, 112 and the heat slug 106 (which is tied to a reference potential). This capacitance can be advantageously utilized to provide input and output impedance matching for the packaged Doherty amplifier 100. According to various simulations, the inventors have discovered that this lead to substrate capacitance can be increased by 200%-300% in comparison to the design described with reference to FIGS. 1-3.

A second modification of the packaged Doherty amplifier 100 relates to the rivets 116. According to embodiments described herein, the die attach area, i.e., the upper surface 118 of the heat slug 106, is completely devoid of rivets 116. Several different package assembly techniques are proposed to achieve this design. In any case, removing the rivets 116 from the die attach area of the heat slug 106 beneficially increases the size of the die attach area. In some designs, removing the rivets 116 increases the available x-axis lateral space (from the perspective of FIG. 1) by approximately 3.1 mm, and increases the overall size of the die attach area (i.e., the available space on the upper surface 118 of the heat slug 106 for the mounting of dies thereon) by about 27%. This modification can allow for greater spacing between the main and peaking amplifiers 102, 104, which provides better electrical isolation and less chance of coupling between the bond wires 114. This modification can enable a beneficial increase in lead pitch (i.e., distance between the centers of adjacent package leads) in some embodiments and/or a beneficial increase in lead spacing (i.e., distance between the edges of adjacent leads). Again, this leads to better electrical isolation. Alternatively, this modification can be used to reduce the size of the packaged Doherty amplifier 100 while maintaining similar spacing between the dies and leads.

A third modification of the packaged Doherty amplifier 100 relates to the configuration of the leads. According to an embodiment, inner sections of the input and output leads 110, 112 that approach the heat slug 106 are bent downward so as to face the sidewalls of the heat slug 106. This modification eliminates the overlap between the input and output leads 110, 112 and the heat slug 106. In some designs, eliminating this increases the available y-axis lateral space by approximately 4.37 mm, and increases the overall size of the die pad (i.e., the available space on the upper surface 118 of the heat slug 106 for the mounting of dies thereon) by about 22%. When this is combined with the removal of the rivets 116 as described above in this package design, an increase of the overall size of the die pad of about 52% can be achieved. An additional advantage of this modification is an increased capacitance between the input and output leads 110, 112 and the heat slug 106 due to the overlap of the bent portions of the input and output leads 110, 112 and the sidewalls of the heat slug 106.

Figure 4:
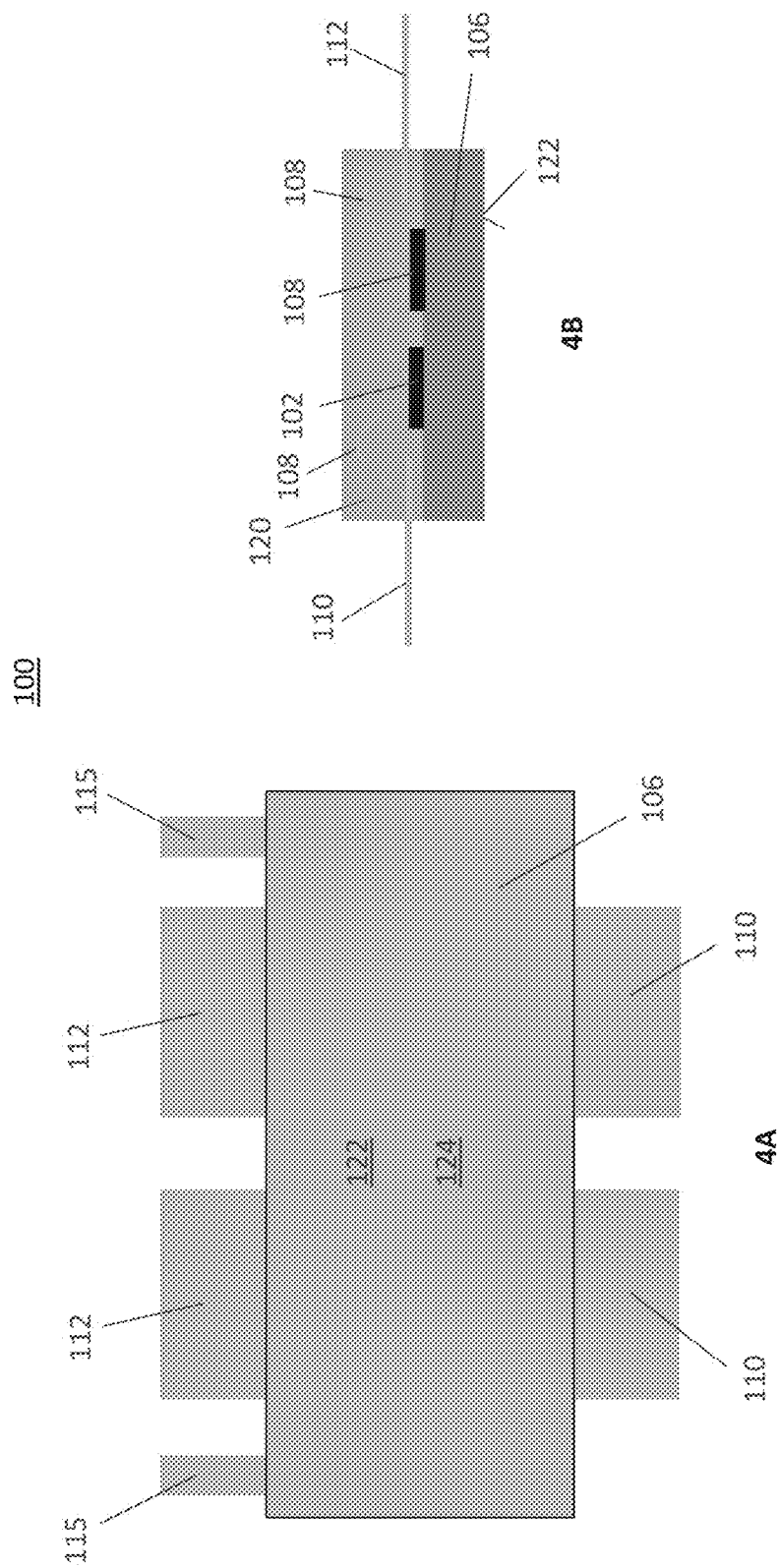
FIG. 4, which includes

Referring to FIG. 4, a packaged Doherty amplifier 100 with an enlarged heat slug 106 is depicted, according to an embodiment. In comparison to the embodiment depicted in FIG. 3, the overmold is eliminated. According to embodiments, the lower side 122 of the package is substantially metallic, i.e., at least 95% metallic, and can be completely metallic in some embodiments. That is, the lower side 122 of the package is substantially devoid or completely devoid of any molding compound. According to an embodiment, the lower side 122 of the semiconductor device package is completely coextensive with the rear surface 124 of the heat slug 106. That is, the heat slug 106 has been enlarged to the maximum extent possible such that the entire lower side 122 of the package is provided by the heat slug 106. Meanwhile, the upper surface 118 of the heat slug 106 can be completely covered with the molding compound 120 so as to encapsulate the semiconductor dies and the bond wires 114. The molding process is carried out in such a way that the entire rear surface 124 of the heat slug 106 is exposed from the molding compound 120.

According to an embodiment, a ratio between the exposed rear surface 124 of the heat slug 106 and a cross-sectional area of the molding compound 120 is 1:1. The cross-sectional area of the molding compound 120 along a plane parallel to the upper surface 118 of the heat slug 106. Thus, in contrast to the embodiment depicted in FIG. 3 in which the mold body is larger than the exposed rear surface 124 of the heat slug 106, the heat slug 106 and the mold body have the same lateral footprint.

Figure 5:
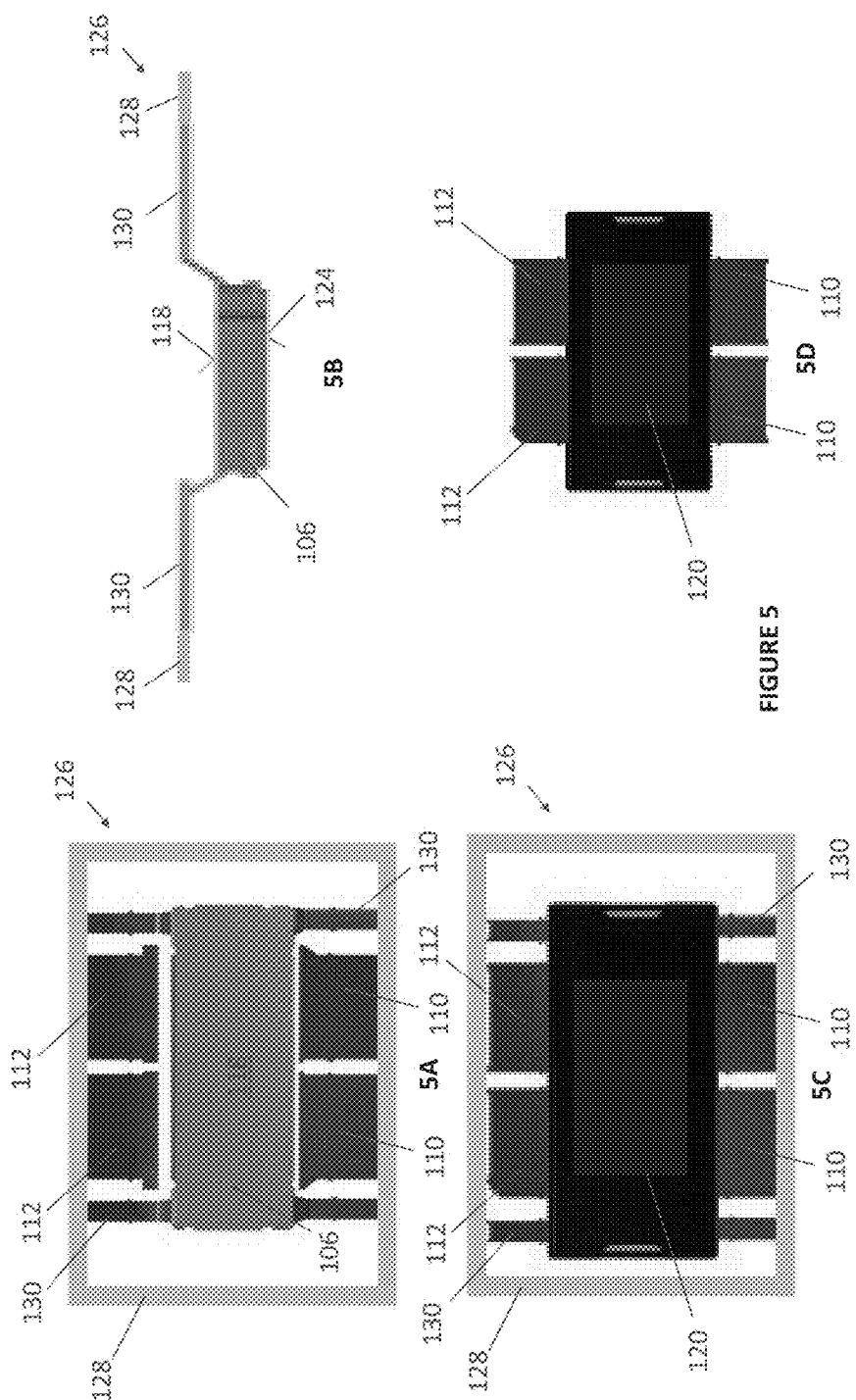
FIG. 5, which includes

Referring to FIG. 5, a method for forming a packaged Doherty amplifier 100 such that the die attach area is completely devoid of rivets 116 is depicted, according to an embodiment. This technique of FIG. 5 does not use any rivet to secure the heat slug 106 to a lead frame 126. According to this technique, the heat slug 106 is integrally formed as part of the lead frame 126. According to an embodiment, this lead frame 126 is a dual thickness lead frame 126. In one embodiment, a peripheral structure 128, the input leads 110, and the output leads 223 have a first thickness, and the heat slug 106 has a second thickness that is greater than the first thickness. In this way, the necessary thickness for the heat slug 106 can be achieved.

As shown in FIGS. 5A and 5B, the heat slug 106 is physically connected to and supported by support posts 130 that connect to a peripheral structure 128 of the lead frame 126. In the depicted embodiment, the peripheral structure 128 has the shape of an enclosed ring. However, other shapes are possible. The input and output leads 110, 112 also connect to the peripheral structure 128 of the lead frame 126. As can be seen in FIG. 5B, the support posts 130 bend downward from the peripheral structure 128 towards the rear surface 124 of the heat slug 106. Thus, the leadframe has a so-called "downset" configuration in which the heat slug 106 is vertically offset (beneath) the other features of the lead frame 126.

Once the lead frame 126 depicted in FIGS. 5A and 5B is provided, semiconductor dies can be affixed to the upper surface 118 of the heat slug 106 and bond wires 114 connecting the semiconductor dies to the leads can be formed, e.g., in the manner previously described. Subsequently, an electrically insulating molding compound 120 can be formed over the heat slug 106 as shown in FIG. 5C. Subsequently, as shown in FIG. 5D, a lead trim and package form process is performed whereby the package leads and the support posts 130 are separated from the peripheral structure 128 and trimmed.

Referring to FIG. 6, a method for forming a packaged Doherty amplifier 100 such that the die attach area is completely devoid of rivets 116 is depicted, according to another embodiment. In this embodiment, the heat slug 106 includes a body section 132. A lower side 134 of the rectangular body section 132 provides the lower side 122 of the package, e.g., as depicted in FIG. 4. An upper side of the rectangular body section 132 provides the die attach area for the heat slug 106. However, different from the embodiment of FIG. 1, the rivet has been moved out of the die attach area. As a result, the entire upper surface 118 of the body section 132 is usable as a die attach area. Thus, dies can be placed anywhere on the body section 132 up to the edge sides of the body section 132.

The heat slug 106 in the embodiment of FIG. 6 includes protrusions 136 that extend away from a first elongated side 138 of the main body section 132. The lead frame 126 is aligned with the heat slug 106 such that the input leads 110 also extend away from the first elongated side 138 in a direction that is parallel to the protrusion 136. That is, the lead frame 126 is aligned with the heat slug 106 such that the input leads 110 are parallel to and spaced apart from the protrusion 136. Additionally, the heat slug 106 includes protrusions 136 that extend away from a third elongated side 140 of the main body section 132 that is opposite the first side 138. The lead frame 126 is aligned such that the protrusions 136 that extend away from the third elongated side 140 are spaced apart from and parallel to the output leads 112. Although four protrusions 136 are illustrated as an example, some of these protrusions 136 can be omitted, and a variety of different configurations are possible. For instance, the heat slug 106 can be configured with two of the protrusions 136 on opposite sides or the same side of the heat slug 106.

In the depicted embodiment, the protrusion 136 has a rectangular shape. However, this is just one example and a variety of different shapes are possible for the protrusion 136. According to an embodiment, the heat slug 106 is a so-called dual gage heat slug 106. An example of this configuration is shown in FIG. 5B. In this embodiment, the heat slug 106 is configured with two regions of different thickness. The thicker region of the heat slug 106 corresponds to the main body section 132 and the thinner region of the heat slug 106 corresponds to the protrusion 136.

Referring to FIG. 6A, the heat slug 106 is affixed to the lead frame 126 using rivets 116 that are provided at a first location on the protrusion 136. The rivet 116 secures the protrusion 136 to a support structure 142, which is connected to the peripheral structure 128 by tie bars. As a result, the heat slug 106 is physically secured to and suspended by the peripheral structure 128 of the lead frame 126. Once secured, semiconductor dies can be attached and electrically connected to the heat slug 106 in the manner previously described. Subsequently, the wire bonds between the input and output terminals of the semiconductor dies and the package leads can be formed in the manner previously described. The rivet 116 ensures that the heat slug 106 remains securely in place during this process.

Referring to FIG. 6C, after die attach and wire bonding, the encapsulation process is performed. During this process, the semiconductor dies and the wire bonds are encapsulated with an electrically insulating molding compound 120 in the manner previously described. The molding compound 120 is formed only on the main body section 132 of the heat slug 106 and is not formed on at least a portion of the protrusion 136. Thus, after encapsulation, the protrusion 136 and the rivet are exposed from the molding compound 120.

Referring to FIG. 6D, after encapsulation, a lead trimming process is performed. During this process, the input and output leads 110, 112 are cut so as to detach the packaged device from the peripheral structure 128 of the lead frame 126. Because the molding compound 120 has been hardened, the leads and the heat slug 106 no long require physical support by the lead frame 126. Accordingly, after the encapsulation process, the rivet is no longer needed. Thus, the protrusion 136 can be trimmed simultaneously or during a common trimming process with the leads during the lead trimming process. Accordingly, the protrusion 136 and the leads are removed. Due to the dual gauge configuration of the heat slug 106, the protrusion 136 is sufficiently thin for conventional lead trimming techniques.

Referring to FIG. 7, a method for forming a packaged Doherty amplifier 100 such that the die attach area is completely devoid of rivets 116 is depicted, according to another embodiment. In this embodiment, the protrusion 136 extends away from a second shorter side 144 of the main body section 132. The heat slug 106 can be configured as a dual gauge heat slug 106 such that the protrusion 136 is thinner than the main body section 132, as shown in FIG. 7B. As shown in FIG. 7A, the heat slug 106 is arranged in the center of the lead frame 126 in a similar manner as shown in FIG. 6A. In this embodiment, the protrusion 136 extends away from the heat slug 106 in a direction that is perpendicular to the input and output leads 110, 112. As shown in FIG. 6A, the heat slug 106 is riveted to the heat frame at a first location that is on the protrusion 136. The rivet 116 secures the protrusion 136 to a support structure 142, which is connected to the peripheral structure 128 by tie bars. Subsequently, die attach and wire bonding is performed in the manner as previously described. Referring to FIG. 7C, after die attach and wire bonding, the encapsulation process is performed in a similar manner as described with reference to FIG. 6C. Referring to FIG. 7D, lead trim and package form is performed in a similar manner as described with reference to FIG. 6D.

Referring to FIGS. 8-10, a method for forming a packaged Doherty amplifier 100 such that the die attach area is completely devoid of rivets 116 is depicted, according to another embodiment. In this embodiment, the heat slug 106 is riveted to the lead frame 126 at a first location that is disposed on the rear surface 124 of the heat slug 106. That is, the rivet 116 is provided on an opposite facing side of the heat slug 106 as the die attach area.

Referring to FIG. 8, according to this embodiment, the body section 132 of the heat slug 106 has a thinner section 148 and a thicker section 150. As shown in FIG. 8A, the heat slug 106 has a non-uniform thickness. The thicker section 150 of the heat slug 106 is provided in a central region of the heat slug 106. The thinner sections 148 of the heat slug 106 are disposed on either side of the central region. The heat slug 106 is configured such that the upper surface 118 extends along a single plane in the thinner and thicker sections 148, 150, as shown in FIG. 8B. In this way, the die attach area extends over the thicker section 150 and the thinner section 148. Meanwhile, the rear surface 124 of the heat slug 106 extends along different planes. More particularly, the rear surface 124 heat slug 106 is elevated (from the perspective of FIG. 8A) in the thinner sections 148 relative to the rear surface 124 of the heat slug 106 in the thicker section 150.

The support post 152 of the lead frame 126 is riveted to the thinner section 148 of the heat slug 106 at the lower side 122 of the heat slug 106. Subsequently, die attach and wire bonding can performed in the manner as previously described. Subsequently, encapsulation can be performed in the manner previously described. In this embodiment, the rear surface 124 of the heat slug 106 and thus the rivet is covered with the molding compound 120. Meanwhile, the rear surface 124 of the heat slug 106 in the central section is exposed from the molding compound 120.

Referring to FIG. 9, a package assembly technique that utilizes the heat slug 106 described with reference to FIG. 8 is depicted, according to an embodiment. As shown in FIG. 9A, the heat slug 106 described with reference to FIG. 8 is provided. As shown in FIG. 9B, a lead frame 126 is provided. The lead frame 126 includes a peripheral structure 128 that encloses a periphery of the lead frame 126. The input and output leads 110, 112 are physically connected to and extend inward from the peripheral structure 128 towards the center of the lead frame 126. Additionally, the lead frame 126 includes rivet pads 154 that are attached to tie bars, which are connected to the periphery of the lead frame 126.

Referring to FIG. 9C, the heat slug 106 is placed in the center of the lead frame 126 and riveted to the rivet pads 154 on the rear surface 124 of the heat slug 106. Subsequently, die attach, wire bonding and encapsulation can be performed in the manner previously described. Subsequently, after hardening of the molding compound 120, the leads and the tie bars can be trimmed so as to detach the packaged device from the peripheral structure 128 of the lead frame 126.

Referring to FIG. 10, a package assembly technique that utilizes the heat slug 106 described with reference to FIG. 8 is depicted, according to another embodiment. As shown in FIG. 10A, the heat slug 106 described with reference to FIG. 8 is provided. As shown in FIG. 10B, a lead frame 126 is provided. The lead frame 126 differs from the lead frame 126 described with reference to FIG. 9 in that the lead frame 126 does not include the input and output leads 110, 112. Instead, the lead frame 126 includes a peripheral structure 128, rivet pads 154 that are attached to tie bars, which in turn are connected to the periphery of the lead frame 126, and four support structures 156 that are connected to the periphery of the lead frame 126. According to a first step of the technique, as shown in FIG. 10C, the heat slug 106 is placed in the center of the lead frame 126 and riveted to the rivet pads 154 in the manner previously described. Subsequently, as shown in FIG. 10D, discrete (detached) input and output leads 110, 112 are provided. The input and output leads 110, 112 include vertical and horizontal posts 158 that extend away from the input and output leads 110, 112. Subsequently, as shown in FIG. 10E, the input and output leads 110, 112 are placed over the heat slug 106. The vertical and horizontal posts 158 are riveted to the four support structures 156. Subsequently, die attach, wire bonding and encapsulation can be performed in the manner previously described. Subsequently, after hardening of the molding compound 120, the leads and the tie bars can be trimmed so as to detach the packaged device from the peripheral structure 128 of the lead frame 126.

In the technique described with reference to FIG. 10, the dual thickness configuration of the heat slug 106 is advantageously utilized to align the input and output leads 110, 112 with the heat slug 106 such that the input and output leads 110, 112 laterally overlap with the heat slug 106 while being vertically spaced apart from the heat slug 106. In comparison to a conventional, single thickness heat slug 106 design, the presently disclosed heat slug 106 sits lower when placed on the lead frame 126. Accordingly, a slight degree of vertical separation, which can be provided by vertically offset vertical and horizontal posts 158 and/or vertically offset support structures 156, is needed to place the input and output leads 110, 112 over the heat slug 106 with some vertical separation between the input and output leads 110, 112 and the heat slug 106. During the encapsulation process, the molding compound 120 occupies the space between the input and output leads 110, 112 and the heat slug 106. This can advantageously produce an intrinsic capacitance between the input and output leads 110, 112 and the heat slug 106. In addition, the lateral overlap advantageously shortens the distance required to effectuate the bond wire connections.

Referring to FIG. 11, a bent lead configuration is depicted, according to an embodiment. As shown the figures, the input and output leads 110, 112 are bent with first sections 158 that are substantially perpendicular to second sections 160. Prior to encapsulation, the input and output leads 110, 112 are aligned with the heat slug 106 in the depicted manner such that the first sections 158 extend away from the heat slug 106 in a direction that is substantially parallel to the upper surface 118 of the heat slug 106. The first sections 158 of the input and output leads 110, 112 can be connected to the peripheral structure 128 of a lead frame 126 in the manner previously described. The second sections 160 of the leads extend in a direction that is substantially parallel to sidewalls 162 of the heat slug 106. The sidewalls 162 of the heat slug 106 extend between the upper and rear surfaces 118, 124 of the heat slug 106.

As shown in FIG. 11C dies can be affixed to the upper surface 118 of the heat slug 106 and electrically conductive bond wires 114 can be used to connect the dies to the input and output leads 110, 112. Subsequently, encapsulation can be performed in the manner previously described. Subsequently, after hardening of the molding compound 120, the leads and any tie bars (if present) can be trimmed so as to detach the packaged device from the peripheral structure 128 of the lead frame 126.

According the embodiment depicted in FIG. 11, the upper surface 118 of the heat slug 106 is coplanar with an upper surface of the second sections 160 of the input and output leads 110, 112. This is made possible by using a planar (i.e., non-downset) lead frame. As a result, the distance between the dies and the input leads 110 is shortened in comparison to a configuration in which the input and output leads 110, 112 are disposed above the upper surface 118 of the heat slug 106.

The term "substantially" encompasses absolute conformity with a requirement as well as minor deviation from absolute conformity with the requirement due to manufacturing process variations, assembly, and other factors that may cause a deviation from the ideal. Provided that the deviation is within process tolerances so as to achieve practical conformity and the components described herein are able to function according to the application requirements, the term "substantially" encompasses any of these deviations.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

In the aforementioned embodiments, a packaged Doherty amplifier 100 circuit is used an example. The packaging techniques and corresponding package structure are not limited to this general circuit type, nor are they limited to the specific circuit described herein. The disclosed modifications are generally applicable to any package design in which the beneficial aspects described herein, e.g., larger die pad area, better thermal dissipation, better isolation, increased lead to substrate capacitance, etc., are useful.

Any or all of the various packaging techniques and corresponding package structures described herein can be combined with one another in a common technique or structure unless incompatible with one another. For example, the enlarged heat slug 106 described with reference to FIG. 4 can be combined with any one of the rivet-free die pad designs described with reference to FIGS. 5-7, which in turn can be combined with the bent lead configuration described with reference to FIG. 11. However, the bent lead configuration described with reference to FIG. 11 is incompatible with the embodiments in which the input and output leads 110, 112 overlap with the heat slug 106, such as the embodiment described with reference to FIG. 10.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a semiconductor device package, comprising:
    providing a lead frame comprising a peripheral structure and a heat slug comprising an upper surface a rear surface, a main body section, and a protrusion that extends away from a side of the main body section, the heat slug being attached to the peripheral structure;
    attaching a semiconductor die to the heat slug; and
    encapsulating the semiconductor die with a molding compound while the heat slug is attached to the peripheral structure,
    wherein providing the lead frame comprises fastening the heat slug to a support structure that is connected to the peripheral structure at a first location on the heat slug, the first location being disposed outside of the main body section, and
    wherein the first location is disposed on the protrusion, wherein encapsulating the semiconductor die comprises covering the main body section with the molding compound while at least part of the protrusion remains exposed from the molding compound, and wherein the protrusion is trimmed after encapsulating.

2. The method of claim 1, wherein encapsulating the semiconductor die comprises forming the molding compound on the entire upper surface of the heat slug without forming any of the molding compound on the rear surface of the heat slug.

3. The method of claim 1, wherein providing the lead frame comprises providing a dual thickness lead frame, wherein the peripheral structure has a first thickness, and wherein the heat slug has a second thickness that is greater than the first thickness, and wherein the heat slug is attached to the peripheral structure and physically supported by support posts that bend downward from the peripheral structure towards the rear surface of the heat slug.

4. The method of claim 1, wherein the protrusion extends away from a first elongated side of the main body section, and wherein the lead frame is arranged during fastening the heat slug to the support structure such that a first lead that is attached to the peripheral structure extends away from the first elongated side in a direction that is parallel to the protrusion.

5. The method of claim 1, wherein the protrusion extends away from a second shorter side of the main body section, and wherein the lead frame is arranged during fastening the heat slug to the support structure such a first lead that is attached to the peripheral structure extends away from the main body section in a direction that is perpendicular to the protrusion.

6. The method of claim 1, wherein the main body section comprises a thinner section and a thicker section, wherein the first location is disposed on the rear surface of the heat slug in the thinner section, and wherein encapsulating the semiconductor die comprises covering the rear surface of the heat slug in the thinner section with the molding compound while the rear surface of the heat slug in the thicker section remains exposed from the molding compound.

7. The method of claim 1, wherein the main body section of the heat slug is completely devoid of fasteners before the encapsulating.

8. The method of claim 2, wherein, after encapsulating, a lower side of the semiconductor device package is completely coextensive with the rear surface of the heat slug.

9. The method of claim 6, wherein the lead frame is provided with support posts that extend inward from the peripheral structure, the method further comprising:
    providing a discrete first lead that is detached from the peripheral structure and comprises vertical and horizontal posts;
    aligning the first lead to laterally overlap with the heat slug, the first lead being vertically spaced apart from the upper surface of the heat slug; and
    fastening the vertical and horizontal posts of the first lead to the peripheral structure.

10. A method of forming a semiconductor device package, comprising:
    providing a lead frame comprising a peripheral structure and a heat slug comprising an upper surface and a rear surface, the heat slug being attached to the peripheral structure;
    attaching a semiconductor die to the heat slug; and
    encapsulating the semiconductor die with a molding compound while the heat slug is attached to the peripheral structure,
    wherein:
    encapsulating the semiconductor die comprises covering the entire heat slug with the molding compound while the entire rear surface of the heat slug is exposed from the molding compound, and wherein a ratio between the exposed rear surface of the heat slug and a cross-sectional area of the molding compound is 1:1, the cross-sectional area of the molding compound being measured in a plane that is parallel to the upper surface of the heat slug.

11. The method of claim 10, wherein the heat slug is attached to the peripheral structure by fastening the peripheral structure to the heat slug at a protrusion that extends away from a main body section of the heat slug, or the rear surface of the heat slug.

12. A method of forming a semiconductor device package, comprising:

providing a lead frame comprising a peripheral structure and a heat slug comprising an upper surface and a rear surface, the heat slug being attached to the peripheral structure;

attaching a semiconductor die to the heat slug; and encapsulating the semiconductor die with a molding compound while the heat slug is attached to the peripheral structure, wherein the lead frame further comprises a first lead that is bent with first sections that are substantially perpendicular to second sections, and wherein the first lead is aligned with the heat slug such that, after encapsulation, the first sections extend away from the heat slug and in a direction that is substantially parallel to the upper surface of the heat slug, and the second sections extend in a direction that is substantially parallel to sidewalls of the heat slug, the sidewalls extending between the upper and rear surfaces of the heat slug.

13. The method of claim 12, wherein a main body section of the heat slug is completely devoid of fasteners before the encapsulating.

14. The method of claim 13, wherein the second sections of the first lead completely overlap with the sidewalls of the heat slug.

\* \* \* \* \*